(12) United States Patent
Chandrasekharan et al.

(10) Patent No.: US 10,491,218 B2
(45) Date of Patent: Nov. 26, 2019

(54) CLOCKED MILLER LATCH DESIGN FOR IMPROVED SOFT ERROR RATE

(71) Applicant: Avago Technologies International Sales Pte. Limited, Singapore (SG)

(72) Inventors: Karthik Chandrasekharan, Chandler, AZ (US); Balaji Narasimham, Aliso Viejo, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 15/952,609

(22) Filed: Apr. 13, 2018

(65) Prior Publication Data
US 2019/0319622 A1  Oct. 17, 2019

(51) Int. Cl.
*G11C 11/00* (2006.01)
*H03K 19/003* (2006.01)
*G11C 11/412* (2006.01)
*G11C 11/419* (2006.01)
*H03K 3/037* (2006.01)

(52) U.S. Cl.
CPC ........ *H03K 19/0033* (2013.01); *G11C 11/419* (2013.01); *G11C 11/4125* (2013.01); *H03K 3/037* (2013.01)

(58) Field of Classification Search
CPC .............. H03K 19/0033; H03K 3/037; G11C 11/4125; G11C 11/419
USPC ......................... 365/148, 154, 163
See application file for complete search history.

(56) References Cited

U.S. PATENT DOCUMENTS

| | | | | |
|---|---|---|---|---|
| 5,854,762 A | * | 12/1998 | Pascucci | G11C 16/225 365/185.04 |
| 6,141,237 A | * | 10/2000 | Eliason | G11C 11/22 365/145 |
| 6,175,528 B1 | * | 1/2001 | Kye | G11C 29/789 365/145 |
| 7,072,218 B2 | * | 7/2006 | Fujito | G11C 7/1051 365/185.18 |
| 8,913,442 B2 | * | 12/2014 | Chen | G11C 11/5642 365/189.07 |
| 2014/0177334 A1 | * | 6/2014 | Chen | G11C 11/5642 365/185.03 |
| 2016/0172037 A1 | * | 6/2016 | Lee | G11C 15/046 365/185.12 |

* cited by examiner

*Primary Examiner* — Harry W Byrne
(74) *Attorney, Agent, or Firm* — Sheridan Ross P.C.

(57) ABSTRACT

Systems, circuits, and chips for hardening a latch/flip-flop circuit against soft errors caused by alpha and neutron radiation are provided. As an example, a latch/flip-flop circuit including a switch to selectively couple a capacitor to first and second storage nodes during a hold phase is disclosed.

18 Claims, 5 Drawing Sheets

CLOCKED MILLER LATCH DESIGN FOR IMPROVED SOFT ERROR RATE

FIELD OF THE DISCLOSURE

The present disclosure is generally directed toward hardened latch and flip-flop circuits.

BACKGROUND

Advances in fabrication technologies for semiconductor integrated circuits (ICs) have resulted in shrinking digital logic circuits and increases in the probability of soft-errors. Although many modern microprocessor's large memory arrays, such as caches or register files, may be protected by error detection and correction (EDAC) schemes, chip-level soft error rates (SER) tend to be dominated by the error rates of latches and flip-flops in application-specific integrated circuits (ASICS), microprocessors, and field-programmable gate arrays (FPGAs). As chip-level logic SER performance worsens with scale, there is a need to increase performance-efficient hardened latch and flip-flop designs to meet Failure-In-Time (FIT) requirements without adding significantly to the space and monetary costs to do so.

Scaling is known to decrease both power supply voltage $V_{cc}$ and capacitance C. In latch and/or flip-flop circuits, the critical charge $Q_{crit}$ is the minimum amount of electron charge disturbance needed to cause a change in the logic level of a portion of a circuit. As $Q_{crit}$ can be calculated according to Equation 1, $Q_{crit}$ may be expected to decrease as a result of scaling the $V_{cc}$ and/or the capacitance C.

$$Q{\rm crit} \propto C \times V_{dd} \qquad \text{Equation 1}$$

The SER may be calculated based on the sensitive drain area $A_{diff}$, the collected charge $Q_{coll}$, and $Q_{crit}$. Accordingly, SER is based on the capacitance C and the Voltage $V_{cc}$.

$$SER \propto A_{diff} \times e^{-\frac{Qcrit}{Qcoll}} \qquad \text{Equation 2}$$

Existing hardening solutions, like dual interlocked storage cell (DICE) carry a large area and performance overhead. Moreover, solutions like triple modular redundancy (TMR) require custom place and route (PnR) flows and cannot be used in ASICS. Accordingly, there is a need to harden circuits to alpha and neutron particles without significantly increasing the area, delay, and power requirements to do so.

BRIEF DESCRIPTION OF THE DRAWINGS

The present disclosure is described in conjunction with the appended figures, which are not necessarily drawn to scale.

DETAILED DESCRIPTION

It is with respect to the above-noted challenges that embodiments of the present disclosure were contemplated. In particular, a system, circuits, and method of operating such circuits are provided that solve the drawbacks associated short-circuit protection circuits of the prior art.

While embodiments of the present disclosure will primarily be described in connection with hardening latch and flip-flop circuits, it should be appreciated that embodiments of the present disclosure are not so limited. In particular, embodiments of the present disclosure can be used in connection with hardening memory circuits where added capacitance may reduce SER as described below.

Various aspects of the present disclosure will be described herein with reference to drawings that are schematic illustrations of idealized configurations. It should be appreciated that while particular circuit configurations and circuit elements are described herein, embodiments of the present disclosure are not limited to the illustrative circuit configurations and/or circuit elements depicted and described herein. Specifically, it should be appreciated that circuit elements of a particular type or function may be replaced with one or multiple other circuit elements to achieve a similar function without departing from the scope of the present disclosure.

It should also be appreciated that the embodiments described herein may be implemented in any number of form factors. Specifically, the entirety of the circuits disclosed herein may be implemented in silicon as a fully-integrated solution (e.g., as a single Integrated Circuit (IC) chip or multiple IC chips) or they may be implemented as discrete components connected to a Printed Circuit Board (PCB).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "include," "includes," 'including," "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Figure 1:
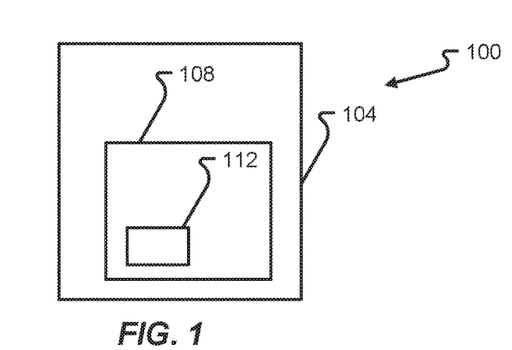
FIG. 1 is a block diagram depicting a first system in accordance with at least some embodiments of the present disclosure.

With reference now to FIG. 1, an illustrative system 100 in which embodiments of the present disclosure may be utilized will be described. The system 100 is shown to include a computing device 104; the computing device 104 may operate as a standalone computing device or may be a part of a larger system employing many computing devices. For example, the computing device 104 may operate together with other computing devices in a parallel or series manner such that one or more computing devices communicate with one another—directly or indirectly. The computing device 104 may include a processor or controller 108. The processor or controller 108 may be implemented as a system-on-chip (SIC) and may include, but is not limited to, at least one of an ASIC, one or more microprocessors, one or more memory blocks, and/or one or more FPGAs. The processor/controller 108 may include a latch/flip-flop 112. The latch/flip-flop 112 may be implemented as a portion of a larger memory block, memory segment, and/or memory chip. The latch/flip-flop 112 generally holds at least one bit of data, as will be described below.

Although certain components are depicted as being included in the latch/flip-flop 112, it should be appreciated that embodiments of the present disclosure are not limited to the depicted configuration of components. Although embodiments of the present disclosure will be described in connection with circuitry for a logic element, such as a latch or flip-flop, it should be appreciated that embodiments of the present disclosure are not so limited. To the contrary, any circuit element exhibiting a behavior that can benefit from some type of soft error hardening disclosed herein could utilize embodiments of the present disclosure. Furthermore, embodiments of the present disclosure are not limited to memory blocks, memory segments, and/or memory chips. Instead, embodiments of the present disclosure can be used in a wide variety of environments including computing applications, server applications, data centers, etc.

Figure 2:
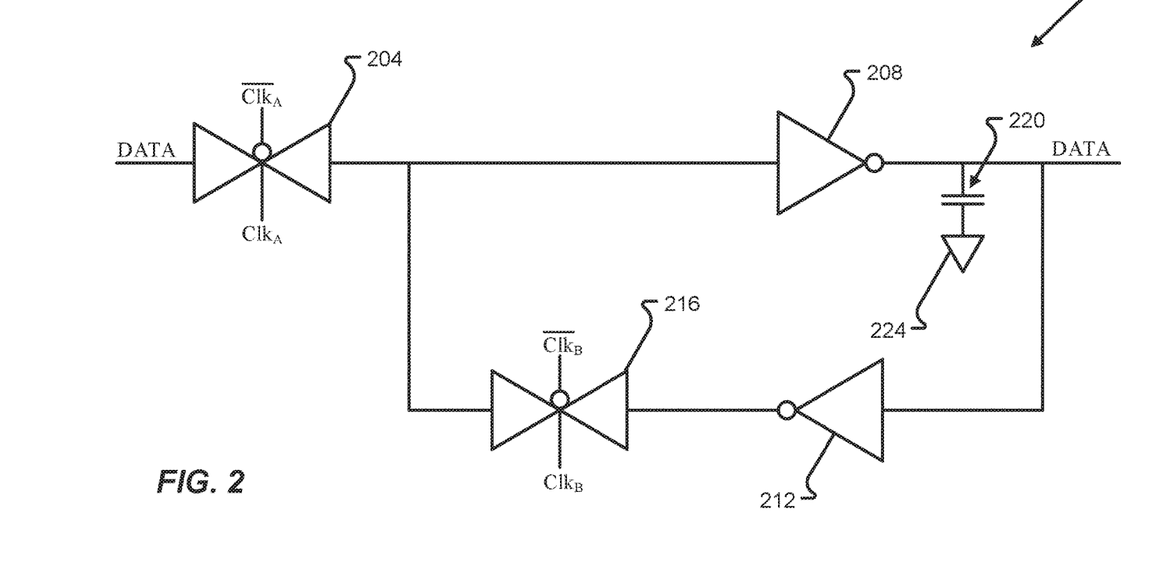
FIG. 2 is a block diagram depicting a latch/flip-flop circuit having a first hardening implementation in accordance with at least some embodiments of the present disclosure.

Now referring to FIG. 2, a latch/flip-flop 200 is depicted. A latch/flip-flop 200 may include a transmission gate 204, an inverter 208, an inverter 212, and a transmission gate 216. Data may be coupled to an input of the inverter 208 in accordance with a clocked signal $Clk_A$ of the transmission gate 204. The transmission gate 204 may be the same as or similar to an analog switch. That is, the transmission gate 204 may be an electronic element that selectively blocks or passes a signal level from the input to the output. In one embodiment, the transmission gate 204 includes a pMOS transistor and an nMOS transistor. Accordingly, a logic high of the $Clk_A$ may pass a logic state signal level, as a data element or single bit, from the input of the transmission gate 204 to the input gate of the inverter 208. As the inverter 208 inverts a logic state signal level, an output of the inverter 208 may be the opposite logic state signal level as the logic state signal level provided at the input to of the inverter 208. The latch/flip-flop 200 may then feed the output of the inverter 208 to the inverter 212, where similar to the inverter 208, the inverter 212 inverts a logic state signal level such that the output of the inverter 212 is the opposite of the logic state signal level provided at the input of the inverter 212.

The transmission gate 216 may be the same as or similar to the transmission gate 204. In accordance with embodiments of the present disclosure, the transmission gate 216 may have a clocked signal $Clk_B$. The clock signal $Clk_B$ may be the inverse of the clock signal $Clk_B$ such that the transmission gate 216 transfers, or passes, the voltage, or logic state signal level, provided at the input of the transmission gate 216 to the output of the transmission gate 216 when the transmission gate 204 is in a blocking state ($Clk_A$ is logic low). Accordingly, with the transmission gate 204 in a blocking state and the transmission gate 216 in a transmission or passthrough state, the latch/flip-flop 200 effectively stores a bit in the circuit defined by the inverter 208, inverter 212, and transmission gate 216, where a first storage node may be between the output of the inverter 208 and the input of the inverter 212 and a second storage node having an opposite logic state signal level as the first storage node, may be between the output of the inverter 212 and the input of the inverter 208.

In accordance with embodiments of the present disclosure, to harden the latch/flip-flop 200 against soft errors mainly caused by alpha radiation, the latch/flip-flop 200 may include a capacitor 220 coupled to ground 224, or logic low, to increase the critical charge, or the minimum amount of electron charge disturbance needed to cause a change the logic level of a portion of the circuit depicted in the latch/flip-flop 200. Because the critical charge is directly proportional to and linearly depends on the size of the capacitor, as the capacitor 220 increases in terms of a charge storage amount, the critical charge also increases. However, as the charge storage amount of the capacitor 220 increases, the size and space requirements of the capacitor 220 also increase. Moreover, a larger critical charge also requires a higher overall power dissipation for the circuit in the latch/flip-flop 200 and further causes the logic transitions of the circuit in the latch/flip-flop 200 to slow, as the setup time and data write delay increase. Therefore, the speed at which the latch/flip-flop 200 operates is generally slower as the capacitor 220 increases in size.

Figure 3:
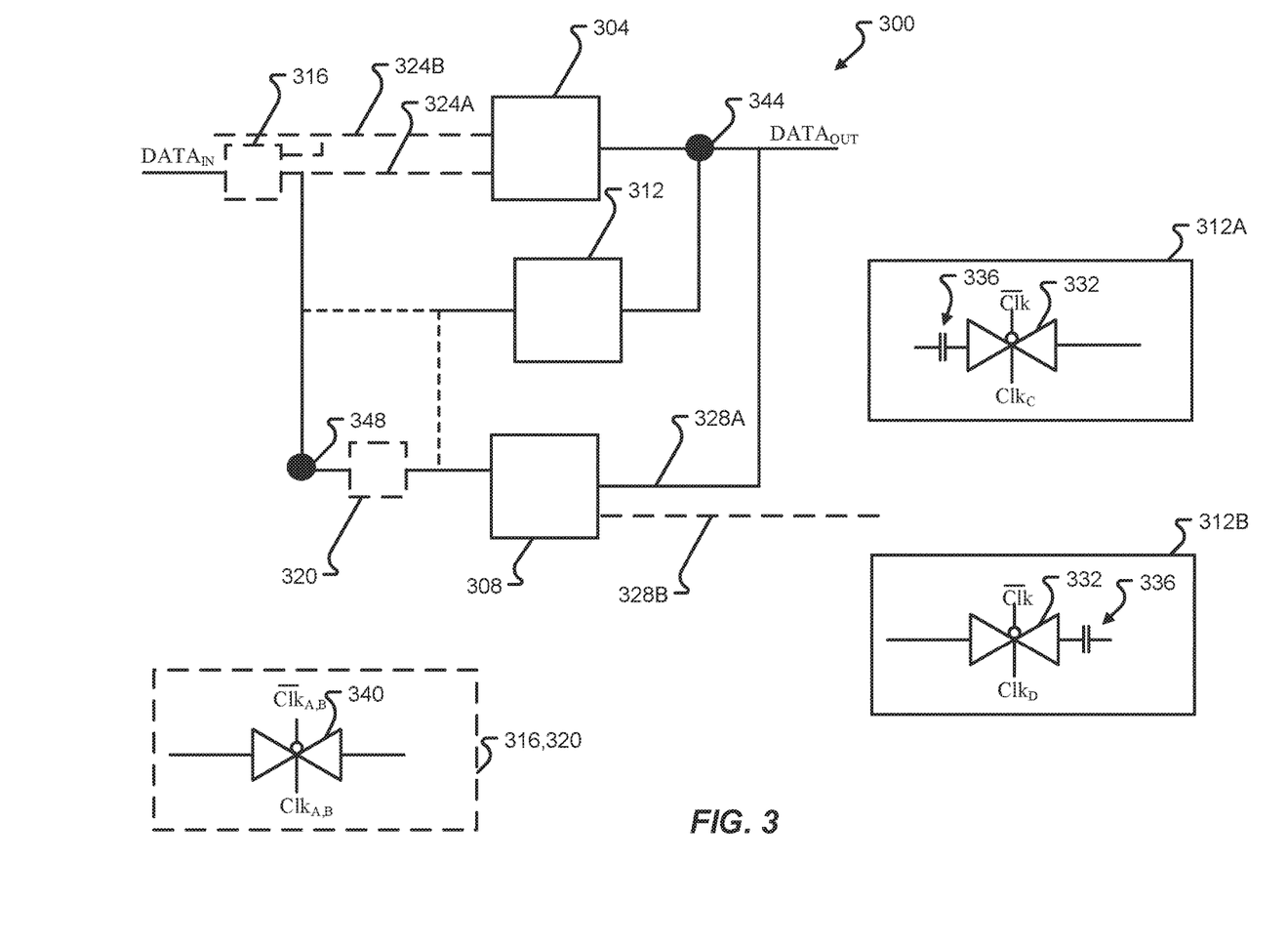
FIG. 3 is a block diagram depicting a latch/flip-flop circuit having a second hardening implementation in accordance with at least some embodiments of the present disclosure.

Now referring to FIG. 3, a latch/flip-flop 300, which may be utilized as the latch/flip-flop 112 circuit, is depicted in accordance with embodiments of the present disclosure. The latch/flip-flop 300 may include an optional transmission gate 316, a logic element 304, a logic element 308, and an optional transmission gate 320. Data may be coupled to an input of the logic element 304 via a first input line 324A in accordance with a clocked signal of the transmission gate 316. The transmission gate 316 may be the same as or similar to the transmission gate 204 and is further depicted in FIG. 3 as including the transmission gate element 340. Accordingly, the optional transmission gate 316 may pass a logic state signal level, as a data element or single bit, from the input of the transmission gate 316 to the input gate of the logic element 304 via the first input line 324A. The logic element 304 may be an inverter, such as inverter 208, or may be, but not limited to a NAND or NOR logic element. If the logic element 304 is a NAND or NOR element, the second input line 324B of the logic element 304 may be coupled to another input and/or data line and/or act as a set or reset input of a latch/flip-flop.

The logic element 304 may receive a logic state signal level received at the first input line 324A of the logic element 304 and provide an inverted logic state signal level as an output, where the inverted logic state signal level is an opposite logic state signal level to the logic state signal level received at the first input line 324A of the logic element 304. The latch/flip-flop 300 may feed the output of the logic element 304 to the logic element 308, where similar to the logic element 304, the logic element 308 inverts a logic state signal level such that the output of the logic element 308 is the opposite of the logic state signal level provided to the first input line 328A of the logic element 308.

The optional transmission gate 320 may be the same as or similar to the optional transmission gate 316. In accordance with embodiments of the present disclosure, the optional transmission gate 320 may have a clocked signal that is opposite to or otherwise the inverse of clocked signal provided to the optional transmission gate 316, such that the optional transmission gate 320 transfers, or passes, the voltage, or logic state signal level, provided to the input of the optional transmission gate 320 to the output of the optional transmission gate 320 when the optional transmission gate 316 is in a blocking state. Accordingly, with the optional transmission gate 316 in a blocking state and the optional transmission gate 320 in a transmission or passthrough state, the latch/flip-flop 300 effectively stores a bit in the circuit defined by the logic element 304, logic element 308, and optional transmission gate 320, where a first storage node may be between the output of the logic element 304 and the input of the logic element 308 and a second storage node having an opposite logic state signal level as the first storage node, may be between the output of the logic element 308 and the input of the logic element 304.

As previously discussed, the optional transmission gate 316 and optional transmission gate 320 may be optional circuit elements and may not be necessary in some embodiments. Where the optional transmission gate 316 and optional transmission gate 320 are not included in the latch/flip-flop 300, the first and second storage nodes may be set utilizing a switch or other means, as can be appreciated by one of ordinary skill in the art. Moreover, where the logic element 304 and/or logic element 308 are single input logic elements, such as an inverter 208 for example, the second input line 324B and second input line 328B would not be required and/or included, as the optional transmission gate 316 may be coupled to the first input line 324A and the output of the logic element 304 may be coupled to the first input line 328A. Further, the optional transmission gate 316 and optional transmission gate 320 may include the transmission gate 340, where the optional transmission gate 316 may be clocked utilizing a $Clk_A$ clock signal and the optional transmission gate 320 may be clocked utilizing a $Clk_B$ clock signal. In some embodiments, the $Clk_B$ clock signal is the inverse of the $Clk_A$ clock signal.

In accordance with embodiments of the present disclosure, the latch/flip-flop 300 may be hardened against soft errors mainly caused by alpha radiation and neutron radiation; such hardening can be accomplished by including the clock gated capacitor 312 between the output of the logic element 304 and the output of the logic element 308 as illustrated in FIG. 3. The clock gated capacitor 312 may also be referred to as a Miller feedback capacitor. As depicted in FIG. 3, the clock gated capacitor 312 may include an capacitor 336 coupled to a transmission gate 332, where the clock gated capacitor 312 may include the capacitor 336 after the transmission gate 332 such as depicted in the clock gated capacitor 312A, or the clock gated capacitor 312 may include the capacitor 336 before the transmission gate 332 such as depicted in the clock gated capacitor 312B. In some embodiments, a combination of the clock gated capacitor 312A and clock gated capacitor 312B may be utilized. The capacitor 336 may be any type of capacitor. For example, non-limiting examples of the capacitor include transistor gate, ceramic, metal, poly, and film type capacitors. Moreover, since the Miller effect is relied upon to increase the perceived capacitance of the capacitor 336, the capacitor may be smaller than, for example, the capacitor 220 of FIG. 2. In accordance with at least one embodiment of the present disclosure, the transmission gate 332 may be replaced with a single transistor acting as a switch. As further depicted in FIG. 3, the clock gated capacitor 312 may be connected at a location between the optional transmission gate 320 and logic element 308 or between the optional transmission gate 320 and logic element 304.

In accordance with embodiments of the present disclosure, the capacitor 336 of the clock gated capacitor 312 may be floating during a write phase of the latch/flip-flop 300 such that a time associated with writing data to the latch/flip-flop 300 is not increased by a time required to provide charge to the capacitor 336 of the clock gated capacitor 312. That is, during a write operation, the capacitor 336 of the clock gated capacitor 312 appears to be in an open and floating state. During a hold operation, when the latch/flip-flop 300 is most vulnerable to soft errors, the capacitor 336 of the clock gated capacitor 312 may be connected to the location between the optional transmission gate 320 and logic element 308 or the location between the optional transmission gate 320 and the logic element 304. Accordingly, the clock signals $Clk_C$ and $Clk_D$ may the same as clock signal $Clk_B$ of the optional transmission gate 320.

When the capacitor 336 is connected between the first and second storage node, the capacitor 336 appears larger during any induced transient caused from ionization and/or other soft error effects. The capacitor 336 appears larger due to the Miller feedback effect. That is, because the gain across the input and output nodes of the logic element 304 and/or logic element 308 is scaled in accordance with the Miller effect and the capacitor appears to be larger. As one example, if the latch/flip-flop 300 is in a hold mode, where the optional transmission gate 316 is in a blocking state and the optional transmission gate 320 is in a passthrough state, the node 344 may be at an active, or logic, low while the node 348 is at an active, or logic, high. If a single event upset (SEU) were to occur at node 344, the SEU may cause the node 344 to be pulled down in voltage. Accordingly, the logic elements 304 and 308 may enter a high gain region and the feedback Miller capacitor 336 may pull the node 348 down such that the node 348 is below a circuit ground which provides a reinforcing current feedback at node 344. The addition of the capacitor 336 makes it more difficult to flip the latch/flip-flop 300, as the critical charge is greater.

As can be appreciated, the addition of the gate clocked capacitor to the latch/flip-flop 300 may yield close to a ten times improvement to the soft error rate caused by alpha particles and a significant improvement to the soft error rate caused by neutron particles while only increasing the size requirements. Moreover, these advantages can be realized without significantly increasing the average power utilized by the gate clocked capacitor.

Figure 4A:
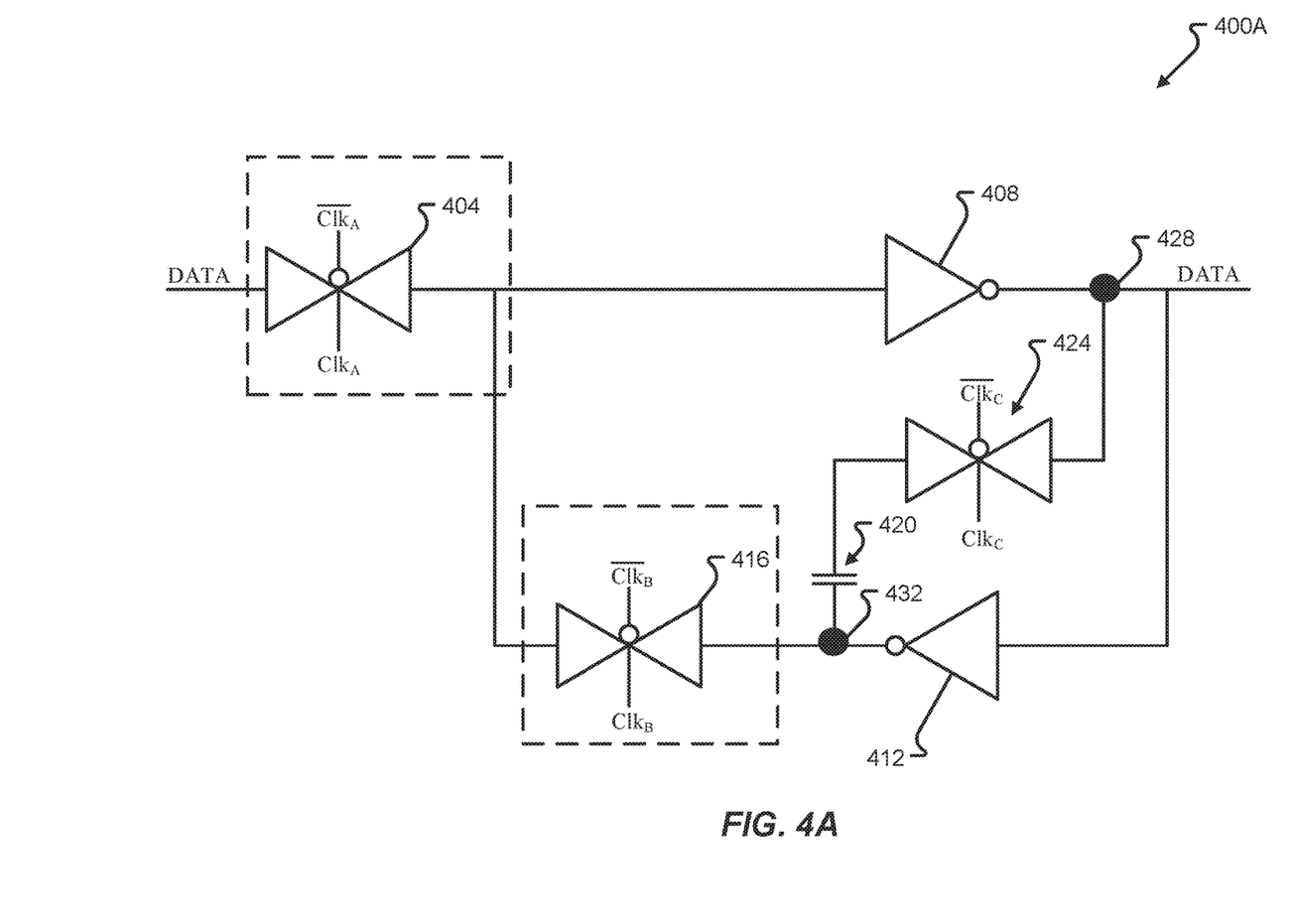
FIGS. 4A-4B are block diagrams depicting additional details of a block diagram having the second hardening implementation in accordance with at least some embodiments of the present disclosure.

Referring now to FIG. 4A, a latch/flip-flop 400A, which may be utilized as the latch/flip-flop 112 circuit, is depicted in accordance with embodiments of the present disclosure. The latch/flip-flop 400A may include a transmission gate 404, an inverter 408, an inverter 412, a transmission gate 416, a transmission gate 424, and a capacitor 420. Data may be coupled to an input of the transmission gate 404 in accordance with a clocked signal of the transmission gate 404. The transmission gate 404 may be the same as or similar to the transmission gate 204. Accordingly, the transmission gate 404 may pass a logic state signal level, as a data element or single bit, from the input of the transmission gate 404 to the input gate of the inverter 408. The inverter 408 may be the same as similar to the inverter 428.

The inverter 408 may receive a logic state signal level and provide an inverted logic state signal level as an output, where the inverted logic state signal level is an opposite logic state signal level to the logic state signal level received at the input of the inverter 408. The latch/flip-flop 400A may feed the output of the inverter 408 to the inverter 412, where similar to the inverter 408, the inverter 412 inverts a logic state signal level such that the output of the inverter 412 is the opposite of the logic state signal level provided to the input of the inverter 412.

The transmission gate 416 may be the same as or similar to the transmission gate 404. In accordance with embodiments of the present disclosure, the transmission gate 416 may have a clocked signal that is opposite to or otherwise the inverse of clocked signal provided to the transmission gate 404, such that the transmission gate 416 transfers, or passes, the voltage, or logic state signal level, provided to the input of the transmission gate 416 to the output of the transmission gate 416 when the transmission gate 404 is in a blocking state. Accordingly, with the transmission gate 404 in a blocking state and the transmission gate 416 in a transmission or passthrough state, the latch/flip-flop 400A effectively stores a bit at a first storage node 428 and a second storage node 432 having an opposite logic state signal level as the first storage node 428.

In accordance with embodiments of the present disclosure, the latch/flip-flop 400A may be hardened against soft errors mainly caused by alpha and neutron radiation; such hardening can be accomplished by including the clock gated capacitor 420 across the input of the inverter 408 and the output of the inverter 408 and/or across the input of the inverter 412 and the output of the inverter 412. The capacitor 420 may be the same as or similar to the previously described capacitor 220 and capacitor 336. In accordance with at least one embodiment of the present disclosure, the transmission gate 424 may be replace with a single transistor acting as a switch. As further depicted in FIG. 4, the clock gated capacitor 420 may be connected at the second storage node 432 between the inverter 412 and the transmission gate 416.

In accordance with embodiments of the present disclosure, the capacitor 420 may be floating during a write phase of the latch/flip-flop 400A such that a time associated with writing data to the latch/flip-flop 400A is not increased by a time required to provide charge to the capacitor 420. That is, during a write operation, the capacitor 420 appears to be in an open and floating state. During a hold operation, when the latch/flip-flop 400A is most vulnerable to soft errors, the capacitor 420 may be connected to the second storage node 432 (or first storage node 428). Accordingly, the clock signals $Clk_C$ may the same as clock signal $Clk_B$ of the transmission gate 416.

Figure 4B:
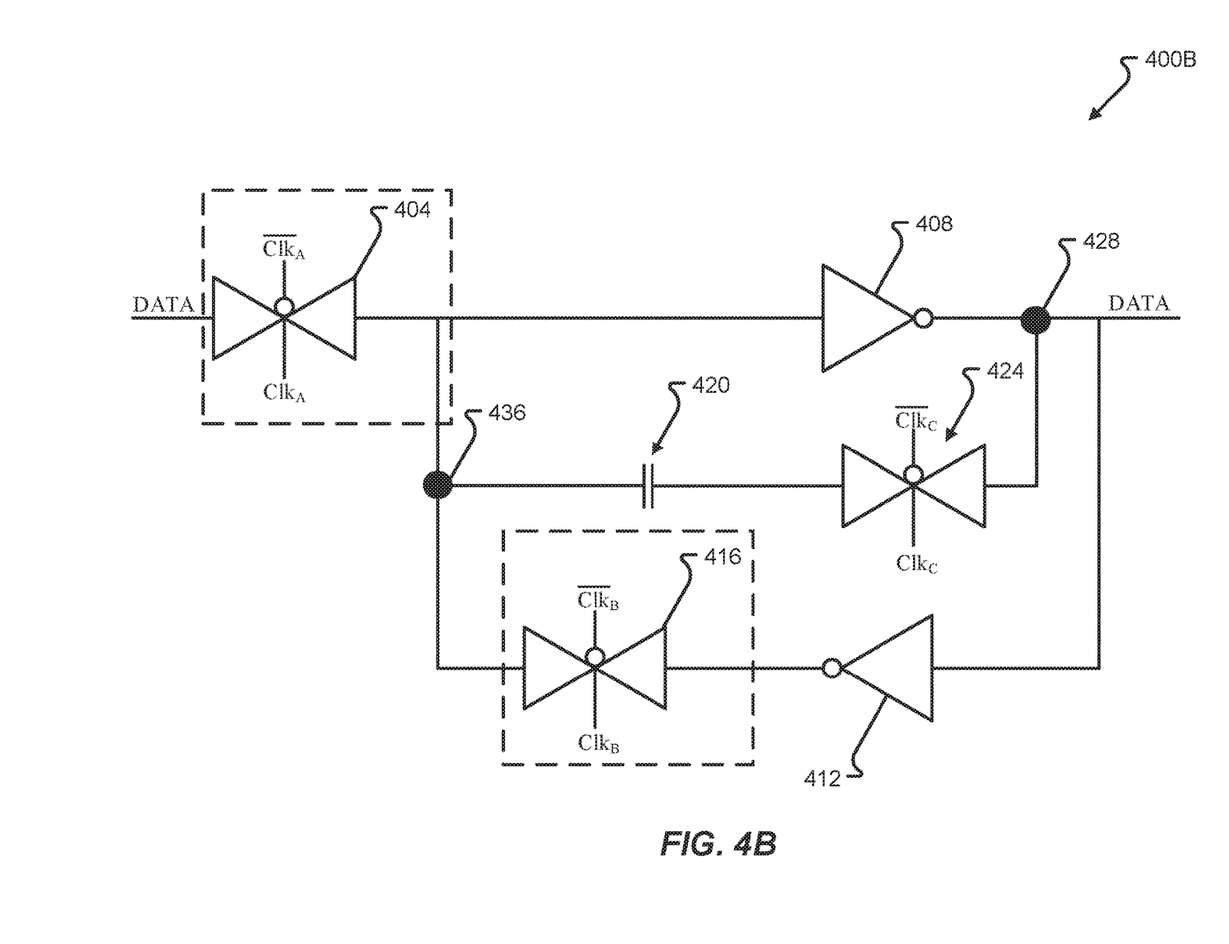

FIG. 4B depicts a latch/flip-flop 400B, which may be utilized as the latch/flip-flop 112 circuit, is depicted in accordance with embodiments of the present disclosure. The latch/flip-flop 400B is the same as or similar to the latch/flip-flop 400A with the exception that the transmission gate 424 and capacitor 420 are provided between the first storage node 428 and the second storage node 436 between the transmission gate 416 and the inverter 408.

Figure 5:
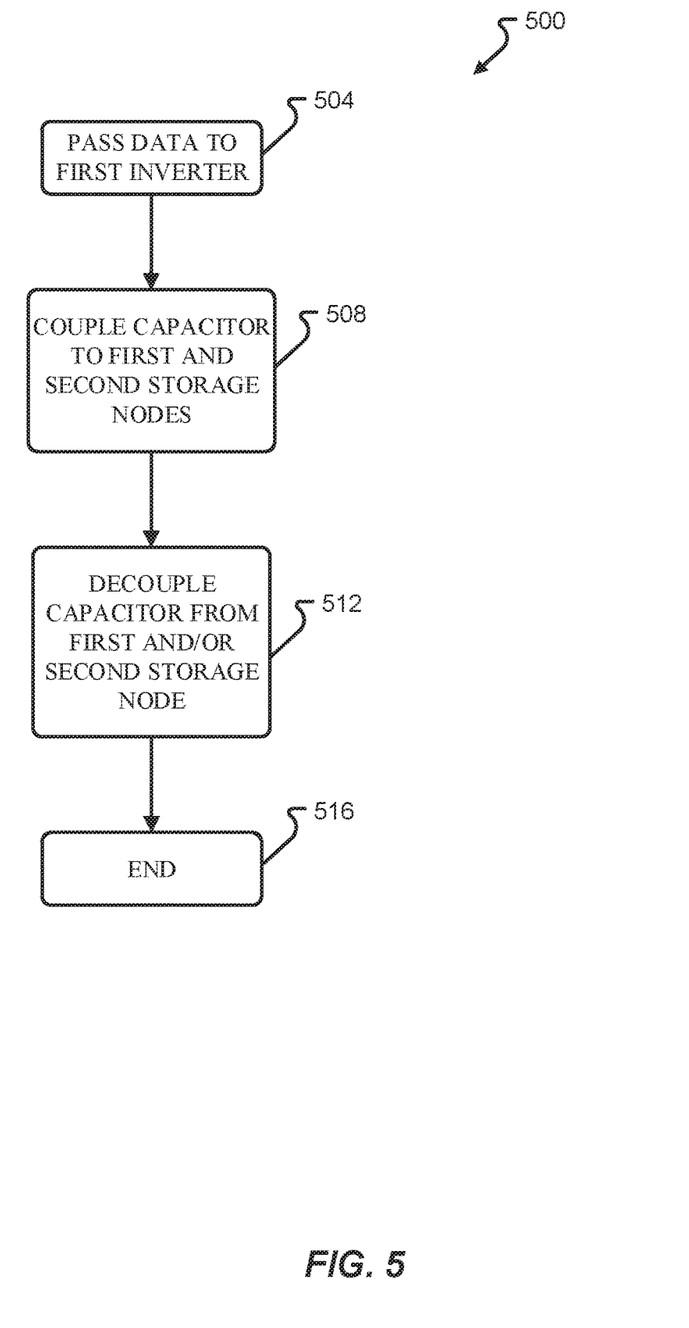
FIG. 5 is a flow diagram depicting a method to harden a latch and/or flip circuit in accordance with at least some embodiments of the present disclosure.

FIG. 5 depicts a method 500 of operating a latch/flip-flop 112, 300, 400A, and/or 400B in accordance with embodiments of the present disclosure. The method 500 begins at step 504, where during a write phase, a first transmission gate, such as the optional transmission gate 316 and/or the transmission gate 404 is clocked to pass the data at the input node of the transmission gate to the output node of the transmission gate and on to a logic element, such as the inverter 408. During step 504, the Miller effect capacitor 336, 420 is not actively coupled to the first and second storage nodes. At step 508 and during a hold phase, the first storage node is coupled to the second storage node by the Miller effect capacitor 336, 420. That is, a transmission gate, or switch, may couple the Miller effect capacitor 336, 420 to the first and second storage nodes. In accordance with embodiments of the present disclosure, the transmission gate, or switch, may couple the Miller effect capacitor 336, 420 to the first and second storage nodes with a clock signal such as $Clk_C$. The clock signal $Clk_C$ may be the same as or similar to the clock signal $Clk_B$. In accordance with embodiments of the present disclosure, the clock signal $Clk_C$ may have a duty cycle that is different from the duty cycle of the clock signal $Clk_B$. At step 512, and during another write phase, the transmission gate, or switch, is configured to an open or blocked state such that the capacitor 336, 420 is floating; stated another way, the capacitor 336, 420 is not actively coupled to both of the first and second storage nodes. That is, the clock signal $Clk_C$ may be an opposite logic level than the logic level at step 508.

In accordance with embodiments of the present disclosure, a circuit is provided. The circuit may include a first logic element having an input and an output and a second logic element having an input coupled to the output of the first logic element and an output coupled to the input of the first logic element. The circuit may additional include a capacitor selectively coupled to the input of the first logic element and the output of the first logic element.

An aspect of the present disclosure includes where the first and second logic elements are logic inverters. Another aspect of the present disclosure includes where a transmission gate selective couples the capacitor to the input of the first logic element and the output of the first logic element. At least one aspect of the present disclosure includes where the capacitor is coupled to the input of the first logic element and the output of the first logic element during a hold phase of the circuit. An aspect of the present disclosure includes where a terminal of the capacitor is in a floating state during a write phase of the logic circuit. Another aspect of the present disclosure includes a first transmission gate between the output of the second logic element and the input of the first logic element and a second transmission gate coupled to the input of the first logic element. At least one aspect of the present disclosure includes where the capacitor is coupled to the input of the first logic element and the output of the first logic element at a same time the first transmission gate couples the output of the second logic element to the input of the first logic element. Another aspect of the present disclosure includes a transmission gate between the output of the second logic element and the input of the first logic element, wherein the capacitor is selectively coupled to a connection between the output of the second logic element and an input of the transmission gate. An aspect of the present disclosure includes a transmission gate between the output of the second logic element and the input of the first logic element, wherein the capacitor is selectively coupled to a connection between the output of transmission gate and the input of the first logic element. Another aspect of the present disclosure includes where the first and second logic elements are part of at least one of a latch circuit or a flip-flop circuit. At least one aspect of the present disclosure includes where the first and second logic elements are part of a memory circuit.

In accordance with embodiments of the present disclosure, a system having a computing device including a controller is provided. The controller may include a first logic element having an input and an output and a second logic element having an input coupled to the output of the first logic element and an output coupled to the input of the first logic element. The controller may further include a capacitor selectively coupled to the input of the first logic element and the output of the first logic element.

An aspect of the present disclosure includes where the first and second logic elements are logic inverters. Another aspect of the present disclosure includes where the capacitor is coupled to the input of the first logic element and the output of the first logic element during a hold phase of the circuit. At least one aspect of the present disclosure includes where a terminal of the capacitor is in a floating state during a write phase of the logic circuit. An aspect of the present disclosure includes a first transmission gate between the output of the second logic inverter and the input of the first logic inverter and a second transmission gate coupled to the input of the first logic inverter. Another aspect of the present disclosure includes where the capacitor is coupled to the input of the first logic element and the output of the first logic element at a same time the first transmission gate couples the output of the second logic element to the input of the first logic element. At least one aspect of the present disclosure includes where the first and second logic elements are part of a memory.

In accordance with embodiments of the present disclosure, a method for hardening a latch against alpha particles is provided. The method may include receiving a first data value at an input of a first inverter, and coupling a capacitor to an output of the first inverter and an input of a first converter during a hold phase at a same time an output of a second inverter is coupled to the input of the first inverter. It is an aspect of the present disclosure where the method includes decoupling the capacitor from the output of the first inverter and the input of the first converter during a write phase.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A circuit, comprising:
   a first logic element having an input and an output;
   a second logic element having an input coupled to the output of the first logic element and an output coupled to the input of the first logic element;
   a capacitor; and
   a first transmission gate that selectively connects the capacitor between the output of the first logic element and the output of the second logic element.

2. The circuit of claim 1, wherein the first and second logic elements are logic inverters.

3. The circuit of claim 1, wherein the first transmission gate includes a first transistor and a second transistor.

4. The circuit of claim 1, wherein the first transmission gate couples the capacitor between the output of the first logic element and the output of the second logic element during a hold phase of the circuit.

5. The circuit of claim 4, wherein a terminal of the capacitor is in a floating state during a write phase of the circuit.

6. The circuit of claim 1, further comprising a second transmission gate between the output of the second logic element and the input of the first logic element and a third transmission gate coupled to the input of the first logic element.

7. The circuit of claim 6, wherein the first transmission gate couples the capacitor to the output of the first logic element and the output of the second logic element at a same time the second transmission gate couples the output of the second logic element to the input of the first logic element.

8. The circuit of claim 1, further comprising a second transmission gate between the output of the second logic element and the input of the first logic element, wherein the first transmission gate selectively connects the capacitor to a connection between the output of the second logic element and an input of the second transmission gate.

9. The circuit of claim 1, further comprising a second transmission gate between the output of the second logic element and the input of the first logic element, wherein the first transmission gate selectively connects the capacitor to a connection between the output of the second transmission gate and the input of the first logic element.

10. The circuit of claim 1, wherein the first and second logic elements are part of at least one of a latch circuit or a flip-flop circuit.

11. The circuit of claim 1, wherein the first and second logic elements are part of a memory circuit.

12. A system having a computing device including a controller, the controller comprising:
    a first logic element having an input and an output;
    a second logic element having an input coupled to the output of the first logic element and an output coupled to the input of the first logic element;
    a capacitor; and
    a first transmission gate that selectively connects the capacitor between the output of the first logic element and the output of the second logic element.

13. The system of claim 12, wherein the first and second logic elements are logic inverters.

14. The system of claim 13, wherein the first transmission gate connects the capacitor to the output of the first logic element and the output of the second logic element during a hold phase of the controller.

15. The system of claim 14, wherein a terminal of the capacitor is in a floating state during a write phase of the controller.

16. The system of claim 13, further comprising a second transmission gate between the output of the second logic inverter and the input of the first logic inverter and a third transmission gate coupled to the input of the first logic inverter.

17. The system of claim 16, wherein the first transmission gate connects the capacitor to the output of the first logic element and the output of the second logic element at a same time the second transmission gate couples the output of the second logic element to the input of the first logic element.

18. The system of claim 12, wherein the first and second logic elements are part of a memory.

* * * * *